United States Patent [19]

Brault

[11] Patent Number: 4,981,778

[45] Date of Patent: Jan. 1, 1991

[54] POLYSILOXANE, RESIST FOR ION BEAM AND ELECTRON BEAM LITHOGRAPHY

[75] Inventor: Robert G. Brault, Santa Monica, Calif.

[73] Assignee: Hughes Aircraft Company, Los Angeles, Calif.

[21] Appl. No.: 885,337

[22] Filed: Jul. 11, 1986

Related U.S. Application Data

[63] Continuation-in-part of Ser. No. 709,019, Mar. 7, 1985, abandoned.

[51] Int. Cl.$^5$ .......................... G03C 1/71; G03C 5/00
[52] U.S. Cl. .................................. 430/273; 430/311; 430/325; 430/270; 430/313; 430/327; 430/296
[58] Field of Search ............... 430/270, 311, 325, 313, 430/327, 273, 296

[56] References Cited

U.S. PATENT DOCUMENTS

| | | | |
|---|---|---|---|
| 4,507,384 | 3/1985 | Morita et al. | 430/311 |
| 4,600,685 | 7/1986 | Kitakohji et al. | 430/270 X |

FOREIGN PATENT DOCUMENTS

| | | | |
|---|---|---|---|
| 0031463 | 7/1981 | European Pat. Off. | 430/330 |
| 0049127 | 4/1982 | European Pat. Off. | |
| 0076656 | 4/1983 | European Pat. Off. | |
| 0163538 | 12/1985 | European Pat. Off. | |
| 0167854 | 1/1986 | European Pat. Off. | |
| 0168246 | 10/1982 | Japan | 430/270 |
| 0096654 | 6/1983 | Japan | 430/270 |

OTHER PUBLICATIONS

T. S. Vasileva et al., "Influence of the condition of continuous hydrolysis of methyl trichlorosilane on the composition of the reaction products"; *International Polymer Science and Technology*, vol. 8, No. 9, 1981, Shurasbyry, (Great Britain), pp. T51-T53.

*Patent Abstracts of Japan*, vol. 6, No. 245, (P-159) (1123), Dec. 3, 1982, Corresponding to Japanese Kokai 57-14162(A), printed Feb. 9; Sep. 2, 1982.

G. H. Wagner et al. "Reactions of Vinyltrichlorosilane and Vinyltriethoxysilane"; *Industrial and Engineering Chemistry*, vol. 45, No. 2, 1953, pp. 367-374.

E. D. Roberts, "The Preparation and Properties of a Polysiloxane Electron Resist", *Journal of the Electrochemical Society*, Dec. 1973, vol. 120, No. 12, pp. 1716-1721.

S. J. Gillespie, "Shaped Siloxane Process"; *Technical Disclosure Bulletin*; vol. 26, No. 7B, Dec. 1983, pp. 3965-3966.

Arthur J. Barry et al., "Crystalline Organosilsesquioxanes", *Journal of American Chemical Society*, vol. 77, Aug. 20, 1955; pp. 4248-4252.

John F. Brown, Jr. et al., "Preparation and Characterization of the Lower Equilibrated Phenylsilsesquioxanes", *Journal of American Chemical Society*, vol. 86, pp. 1120-1125 (Mar. 1964).

Andrianov et al. "Synthesis of Methylphenylsilsesquioxanes", *Iz. Akad. Nauk. SSSR, Ser. Khim, No. 6, (Jun. 1967), pp. 1339-1340.*

Primary Examiner—Paul R. Michl
Assistant Examiner—Cynthia Hamilton
Attorney, Agent, or Firm—Wanda K. Denson-Low; A. W. Karambelas

[57] ABSTRACT

A method for providing a high temperature imaging resist layer for use in a multilayer resist system. A relatively thick planarizing resist layer is coated onto a suitable substrate to provide a planarizing resist layer having a planar surface. A relatively thin layer of a solvent soluble polysilsesquioxane polymer resist is applied to the planar surface to form an imaging resist which remains solvent soluble at temperatures up to 250° C. The hydroxyl or alkoxy content of the polysilsesquioxane must be 0.05 weight percent or less in order to prevent cross linking of the polysilsesquioxane. The polysiloxane polymer resist is prepared by hydrolizing and polymerizing trichlorosilanes having the formula $RSiCl_3$ where R is methyl, phenyl, vinyl, n-butyl, t-butyl, chlorophenyl, or chloromethyl-phenyl. The hydroxyl content of the polysilsesquioxane is reduced to 0.05 weight percent by capping the polymer with monoreactive silanes. The polysiloxane imaging resist is designed for use in high temperature electron beam and ion beam lithography.

13 Claims, No Drawings

[4,981,778]

POLYSILOXANE, RESIST FOR ION BEAM AND ELECTRON BEAM LITHOGRAPHY

This application is a continuation-in-part of application Ser. No. 709,019, filed Mar. 7, 1985, now abandoned.

BACKGROUND OF THE INVENT

1. Field of the Invention

The present invention relates generally to multi-layer resist systems for use in ion beam and electron beam lithography. More particularly, the present invention relates to a new polysiloxane, specifically a polysilsesquioxane, imaging resist layer which is suitable for use at relatively high temperatures up to approximately 250° C.

2. Description of the Background Art

Advances in the fabrication of integrated circuits and other semi-conductor systems have made it necessary to provide lithography techniques capable of producing pattern sizes in the micrometer and submicrometer range. Electron beam and ion beam lithographic techniques are commonly used because of the extremely fine resolution provided by the electron and/or ion beam. Single layer resist systems have been used with only limited success for electron beam and ion beam imaging. In single layer resist systems one can achieve high aspect ratios in narrow isolated lines with electron-beam lithography. For example, 1 Mm high lines that are 0.2 micron wide are possible. However, one cannot get two lines close together when using a single layer resist with electronbeam lithography. With a single layer resist system, two lines that are 1 micron apart cannot be resolved due to limitations caused by proximity effects. These effects include electron scattering within the resist as well as back scatter of electrons from the substrate. With focused ion beam lithography the proximity effects are much less pronounced; however, the stopping distance of the metal ions used, i.e., silicon, gallium, etc. limits the depth of images to on the order of 0.3 micron or less.

In order to overcome the problems presented by single-layer resist systems, multiple-layer systems have been developed. These systems are classified by the number of layers in the system. Bi-level or bi-layer resist systems have been particularly popular due to their simplicity and high resolution characteristics. The standard bi-layer resist typically includes a relatively thick (approximately 2 micron) organic layer which is generally made from a hard-baked organic polymer chosen for adhesion to the substrate and high resistance to dry etching. This bottom layer is commonly referred to as the planarizing layer. On top of the planarizing layer is placed a relatively thin layer of resist which has the dual function of both an imaging layer and a conformable mask for etching the underlying planarizing layer.

Silicon-containing polymers such as polysiloxanes, silicone oils, silicone gums and silicon-containing methacrylate polymers have been used as the top imaging resist layer. The silicon compounds are radiation sensitive so that they function as a negative resist when exposed to an electron or ion beam. After exposure, the imaging layer is treated with a suitable solvent to remove the unexposed portions of the imaging layer. The exposed portions are insoluble in the solvent due to cross-linking resulting from exposure to the ion beam or electron beam radiation. The remaining imaging resist layer pattern serves as an etch mask for pattern transfer to the underlying planarizing polymer by way of reactive ion etching (RIE) with oxygen plasma. During the processes, the outermost portions of the imaging resist are converted to silicon dioxide. The converted silicon dioxide is believed to serve as the actual etch mask.

Polysiloxanes which are prepared by the hydrolysis of alkyltrichlorosilane have been used as the imaging resist layer. The polysiloxanes are glassy polymers which have a structure characterized as a "broken ladder". The polysiloxanes are high in silicon content so that they provide an especially suitable silicon dioxide mass which has high resistance to RIE in an oxygen plasma. Further, the polysiloxanes have a higher glass transition temperature than silicone oils and gums so that images are not as easily deformed.

Although polysiloxanes have been found useful as an imaging resist layer in bi-layer resist systems, problems have been experienced with cross-linking of polysiloxane at temperatures above 70° to 100° C. Many times, it is desirable to carry out ion beam or electron beam lithography on a resist that has been heated at temperatures above 100° C. to improve the adhesion of the resist to the substrate and to eliminate as much solvent from the resist as possible. Cross-linking of the polysiloxane at temperatures above 100° C. results in the formation of an imaging resist layer which is insoluble over its entire surface and therefore unsuitable for electron beam and ion beam lithography. It would be desirable to provide an improved polysiloxane imaging resist which can be used for electron beam or ion beam lithography at temperatures above 100° C. without undesirable cross-linking of the polymer.

SUMMARY OF THE INVENTION

In accordance with the present invention, a top imaging layer is provided which can be used at temperatures above 100° C. and up to 250° C. without becoming cross-linked or otherwise unusable. The present invention is based upon the discovery that polysiloxanes in particular, polysilsesquioxanes used as negative resists may be treated with monohalosilanes to reduce the hydroxyl or alkoxy content of the polysiloxane such that the polysiloxane polymer resist when applied as the top layer in a multi-layer resist systems remains solvent soluble at temperatures up to 250° C.

The method in accordance with the present invention involves providing a substrate having a relatively thick planarizing resist layer coated thereon. The planarizing resist layer has a planar surface upon which the imaging resist layer is coated. A relatively thin layer of a solvent soluble polysilsesquioxane polymer resist is applied on the planar surface to form the imaging resist layer. As a particular feature of the present invention, the a polysilsesquioxane polymer has a hydroxyl content of approximately 0.05 weight percent or less so that the polysilsesquioxane polymer resist remains solvent soluble at temperatures up to 250° C. A hydroxyl or alkoxy content of 0.05 weight percent corresponds to about two hydroxyl groups or two alkoxy groups in a polysilsesquioxane polymer having a molecular weight of approximately 68,000.

The polysiloxane polymers in accordance with the present invention are those made from the hydrolysis and polymerization of trichlorosilanes having the formula $RSiCl_3$ where R is methyl, phenyl, vinyl, n-butyl, t-butyl, chlorophenyl or chloromethyl-phenyl and wherein the hydroxyl content of the polysilsesquioxane is reduced to approximately 0.05 weight percent or below by end capping the polysiloxane with a monreactive silane.

The capped polysilsesquioxane resist, in accordance with the present invention, provides an improved imaging resist layer which can be stored for long periods of time without undesirable excess cross-linking and which can be used in high temperature environments up to 250° C. This is an improvement over presently available polysiloxane resists which tend to cross-link and become insoluble when stored over long periods of time and which are not suitable for use at temperatures above 70° to 100° C.

The above discussed and many other features and attendant advantages of the present invention will become apparent as the invention becomes better understood by reference to the following detailed description.

DETAILED DESCRIPTION OF THE INVENTION

The present invention is directed to polysiloxane polysilsesquioxane imaging resist layers which are used as the top layer in a multi-layer resist system. Multi-layer resist systems are well known and widely used in electron beam and ion beam lithography. Although the polysiloxane imaging resist layer of the present invention may be used in multi-layer systems having more than two resist layers, it is preferred that the polysiloxane resist layer be used in combination with a single organic planarizing resist layer. The substrate upon which the planarizing layer is coated is not important and may, for example, be any of the typical substrate utilized in micro-circuit fabrication. The planarizing layer may be any of the well-known organic layers used in multi-layer resist systems, such as a photo-resist or polyimide. The planarizing or leveling layer is preferably between 1–3 microns thick and is attacked by oxygen during RIE in an oxygen plasma. The planarizing resist layer must be of a suitable material which forms a planar surface upon which the polysiloxane polymer in accordance with the present invention may be coated to form the top imaging resist layer.

The polysiloxanes, more particularly, the polysilsesquioxanes in accordance with the present invention are prepared by the hydrolysis and partial polymerization of trichlorosilanes having the formula $RSiCl_3$ where R is methyl, phenyl, vinyl, n-butyl, t-butyl, chlorophenyl or chloromethylphenyl. The hydrolysis and partial polymerization of the above trichlorosilanes is carried out according to the method set forth in G. H. Wagner, et al., *Industrial and Engineering Chemistry*, Volume 45, No. 2, page 367–374 (1953) and E. D. Roberts, J. Electrochem. Soc., Vol. 120, No. 12, pages 1716–1721 (1973). The contents of these two articles is specifically incorporated by reference.

The procedure for preparing polysiloxanes more particularly, polysilsesquioxanes involves hydrolyzing the trichlorosilane in ice water to form a polymer which is then equilibrated with a base such as sodium hydroxide or ammonium hydroxide to produce a solid polymer having a molecular weight of between about 10,000 to 100,000. This solid polymer is soluble in solvents such as benzene, diethyl ether, methyl isobutyl ketone, ethyl ether, toluene, cellosolve acetate and the like. Typical polymers prepared by this method contain in the neighborhood of 0.3 weight percent hydroxyl groups (OH) as SiOH. Polysiloxanes of this type in which the hydroxyl content is above 0.1 by weight, are unstable at temperatures above 70° to 100° C. and tend to form cross-linked polymers which are insoluble in the above-mentioned solvents. For example, the polyvinyl siloxane prepared by Dubois and Gazard (J. C. and M. Gazard, *5th International Conference on Electron and Ion Beam Science and Technology*, page 112 (1972)) is prepared according to the basic hydrolysis procedure described above in which vinyl trichlorosilane is hydrolyzed in ethyl ether and then polymerized with ammonium hydroxide. The white powder obtained after drying must be kept in a dry atmosphere, otherwise undesirable cross-linking of the polymer occurs. This particular polyvinyl siloxane resist could not be heated above 75° C. without cross-linking taking place. The contents of this article is also hereby incorporated by reference.

It was discovered in accordance with the present invention that reducing the hydroxyl content of polysiloxane polymers in particular, polysilsesquioxane polymers, to below 0.05 weight percent provides an imaging resist which is stable over long periods of time and which does not cross-link when heated to temperatures of up to 250° C. The preferred method for reducing the hydroxyl content to below 0.05 weight percent is to treat the polysiloxane immediately after preparation with a monoreactive silane. Monoreactive silanes have been used in the past to cap silicon oils to produce a non-reactive oil. Monoreactive silanes which are suitable for use in capping polysiloxanes to reduce hydroxyl content and prevent cross-linking at high temperatures include those monohalosilanes selected from the group consisting of ethyldimethylchlorosilane, t-butyldimethylchlorosilane, n-butyldimethylchlorosilane, triethylchlorosilane, triethylbromosilane, trimethylchlorosilane, trimethylbromosilane, triisopropylchlorosilane and vinyldimethylchlorosilane.

The particular procedure used to cap the polysiloxane with the monohalosilane is not critical so long as the hydroxyl content is reduced to 0.05 weight percent or below. Typically, the capping of the polysiloxane is accomplished simply by mixing the monohalosilane with the polysiloxane and/or base and allowing the capping reaction to occur until the desired reduction in hydroxyl content of the polysiloxane is achieved. The reaction is stopped by adding water to the mixture.

It was found that a family of commercial alkyl polysiloxanes marketed by Owens-Illinois Corporation as O-I GLASS RESIN 908 (GR 908), methylphenylpolysiloxane could be capped to provide polysiloxanes more particularly, polysilsesquioxanes, in accordance with the present invention. GR 908 is a polysiloxane in which the hydroxyl groups are replaced by alkoxy groups. The alkoxy groups, like the hydroxyl groups, provide sites for undesirable cross-linking of the resin. It is believed that the alkoxy content of the GR 908 polysiloxane, methylphenylpolysiloxane is at or above 0.3 weight percent. The GR 908 alkyl polysiloxane methylphenylpolysiloxane cannot be heated to temperatures above 100° C. without cross-linking. Capping of this commercial glass resin utilizing the monohalosilanes in accordance with the present invention produces an alkyl polysiloxane, more specifically, a polysilsesquioxane, which does not cross link at temperatures up to 250° C. This provides a suitable alkyl polysiloxane more particularly, a polysilsesquioxane, which may be used as an imaging resist layer when the electron beam or ion beam lithography is to be carried out at temperatures above 100° C.

Examples of practice are as follows:

Preparation of Trimethylsilyl Capped Phenylpolysiloxane

A mixture of 50 ml pheryltrichlorosilane in 250 ml benzene was slowly added to a 2 liter beaker with 500 ml water. The mixture was stirred vigorously for 4 hours. The mixture was washed with water. After separating the water, then 0.4 grams potassium hydroxide was added and it was refluxed 4 hours. The mixture was placed in a separatory funnel and washed three times with water to remove salts and base. The benzene layer was dried. 2.5 ml trimethylchlorosilane was added and it was stirred for eight hours. Water was added to stop the reaction and the mixture placed in a separatory funnel and washed with water two times. After drying, the solvent was removed by evaporation yielding 26 grams of product which has a hydroxyl content of less than 0.05 weight percent and a molecular weight of approximately 10,000.

Preparation of Vinyldimethylsilyl Capped GR908

50 grams of Owens-Illinois GR908 was dissolved in 75 cc toluene to which was added 30 g triethylamine and 30.2 g vinyldimethylchlorosilane. This was stirred for 16 hours and the reaction mixture was poured into 250 ml of methanol. About 25cc water was added to precipitate the product. The product was recovered by filtration and dried in air. The crude product was dissolved in methyl isobutyl ketone and then filtered through a 0.5 micrometer membrane filter and precipitated again from methanol. Yield of dried product was 27 g. The alkoxy content was also less than 0.05 weight percent for this product.

Preparation of Trimethylsilyl Capped GR908

50 grams of O-I Glass Resin 908 was placed in a flask with 350 ml of ethyl ether, 10 cc pyridine, and 10 cc trimethylchlorosilane. The mixture was stirred for 48 hours. The solution was hydrolyzed and cleaned up by shaking with fresh water three times. The ether layer was dried over anhydrous sodium sulfate and the ether removed by evaporation. The yield was 48 grams of product having an alkoxy content of less than 0.05 weight percent.

Preparation of Poly(p-chlorophenylsilsesquioxane)

A mixture of 50 grams p-chlorophenyltrichlorosilane in 50 cc toluene was added into 500 cc water which was rapidly stirred continuously for one hour. The water layer was separated and removed. The organic layer was placed in a round bottomed flask fitted with a Dean-Stark trap. One pellet (0.1 gram) of potassium hydroxide was added and the mixture was heated overnight with water being removed continuously. The product was recovered by precipitation from methanol and dried in vacuum. The product has a hydroxyl content of less than 0.05 weight percent.

All four of the above exemplary capped polysiloxanes do not cross link at temperatures between 100° C. and 250° C. and remain soluble in conventional polysiloxane resist solvents as previously listed.

Resists are prepared by dissolving the above polysiloxanes in a solvent, such as methyl isobutyl ketone, and filtering through a 0.5 micron Teflon filter. The polysiloxane solution is then spin cast or otherwise applied as a thin film onto the planarizing resist layer. The polysiloxane resist layer is preferably 0.04 to 0.5 micron thick. Sensitivities were determined for electron-beam and ion-beam exposures. Listed below are the electron-beam results for the two GR908 resists, the one capped with trimethylsilyl and the other capped with dimethylvinylsilyl.

| Base Resin | Capping Group | Sensitivity (Q) C/cm2 | Contrast ( ) |
|---|---|---|---|
| O-I GR908 | Trimethylsilyl | 182 | 2.31 |
| O-I GR908 | Dimethylvinylsilyl | 41.5 | 1.93 |

The trimethylsilyl capped O-I GR908 has an ion beam sensitivity to 150 keV $Si^{++}$ of $2.5 \times 10^{12}$ ions/cm$^2$. Resist lines 2000A wide have been reproducted with a focused 70 keV $Ga^+$ beam with a dose of about $10^{13}$ ions/cm$^2$.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for providing a high temperature imaging resist layer in a multilayer resist system comprising the steps of:
   providing a substrate having a relatively thick planarizing resist layer coated thereon, said planarizing resist layer having a planar surface upon which an imaging resist layer may be coated; and
   applying a relatively thin layer of a solvent soluble polysiloxane polymer resist on said planar surface to form said imaging resist layer, said polysiloxane polymer resist being a polymer made from the hydrolysis and polymerization of a trichlorosilane having the formula $RSiCl_3$ where R is methyl, phenyl, vinyl, n-butyl, t-butyl, chlorophenyl or chloromethylphenyl and wherein the hydroxyl content of said polysiloxane is reduced to approximately 0.05 weight percent or below by end capping said polysiloxane with a monoreactive silane.

2. A method according to claim 1 wherein said monoreactive silane is selected from the group of monohalosilanes consisting of ethyldimethylchlorosilane, t-butyldimethylchlorosilane, n-butyldimethylchlorosilane, triethylchlorosilane, triethylbromosilane, trimethylchlorosilane, trimethylbromosilane, triisopropylchlorosilane and vinyldimethylchlorosilane.

3. A method according to claim 1 wherein the monoreactive silane is used to cap the OWENS-ILLINOIS GR 908 Glass Resin, methylphenylsilsesquioxane, in order to reduce the alkoxy content to approximately 0.05 weight percent or less, is trimethylchlorosilane.

4. A method according to claim 2 wherein said solvent soluble polysiloxane polymer resist is a phenylpolysiloxane.

5. A method according to claim 4 wherein said monoreactive silane used to cap the phenylpolysiloxane to reduce the hydroxyl content to approximately 0.05 weight percent or less is trimethylchlorosilane.

6. A method according to claim 1 wherein the monoreactive silane that is used to cap the OWENS-ILLINOIS GR 908 Glass Resin, methylphenylsilsesquioxane, in order to reduce the alkoxy content to approximately 0.05 weight percent or less, is vinyldimethylchlorosilane.

7. A method for providing a patterned imaging resist layer in a multilayer resist system comprising the steps of:

providing a substrate having a planarizing resist layer coated thereon, said planarizing resist layer having a planar surface upon which an imaging resist layer may be coated;

applying a layer of a solvent soluble polysilsesquioxane polymer resist on said planar surface to form said imaging resist layer, said polysilsesquioxane having a hydroxyl or alkoxy content of approximately 0.05 weight percent or less, said polysilsesquioxane polymer resist remaining solvent soluble at temperatures up to 250° C.;

exposing selected areas of said polysilsesquioxane imaging resist layer to a sufficiently intense ion beam or electron beam to cause polymerization of the exposed area to form solvent insoluble areas;

treating said polysilsesquioxane imaging resist layer with sufficient solvent to remove the unexposed and solvent soluble ares of said imaging resist layer; and converting the remaining solvent insoluble areas to a silicon containing oxide.

8. A multilayer resist system adapted for use at temperatures up to 250° C. comprising:

a substrate having a planarizing resist layer coated thereon, said planarizing resist layer having a planar surface;

a layer of a solvent soluble polysilsesquioxane polymer resist coated on said planar surface to form an imaging resist layer, said polysilsesquioxane having a hydroxyl or alkoxy content of approximately 0.05 weight percent or less and said polysilsesquioxane remaining solvent soluble at temperatures up to 250° C.

9. A multilayer resist system adapted for use at temperatures of up to 250° C. comprising:

a substrate having a relatively thick planarizing resist layer coated thereon, said planarizing resist layer having a planar surface;

a relatively thin layer of a solvent soluble polysiloxane polymer resist coated on said planar surface to form an imaging resist layer said polysiloxane is a polymer made from the hydrolysis and polymerization of a trichlorosilane having the formula RSiCl$_3$ where R is methyl, phenyl, vinyl, n-butyl, t-butyl, chlorophenyl or chloromethylphenyl and wherein the hydroxyl content of said polysiloxane is reduced to 0.05 weight percent or below by end capping said polysiloxane with a monoreactive silane.

10. A multilayer resist system according to claim 9 wherein said monoreactive silanes are selected from the group of monohalosilanes consisting of:

ethyldimethylchlorosilane, t-butyldimethylchlorosilane, n-butyldimethylchlorosilane, triethylchlorosilane, triethylbromosilane, trimethylchlorosilane, trimethylbromosilane, triisopropylchlorosilane and vinyldimethylchlorosilane.

11. A multilayer resist system according to claim 10 wherein said solvent soluble polysiloxane polymer resist is a phenylpolysiloxane.

12. A multilayer resist system according to claim 11 wherein said monoreactive silane used to cap the phenylpolysiloxane to reduce the hydroxyl content to approximately 0.05 weight percent or less is trimethylchlorosilane.

13. A multilayer resist system according to claim 8 wherein the monoreactive silane that is used to cap the GR 908 Glass Resin, methylphenylsilsesquioxane, in order to reduce the alkoxy content to approximately 0.05 weight percent or less, is vinyldimethylchlorosilane.

* * * * *